United States Patent [19]

Basser et al.

[11] Patent Number: 5,539,310
[45] Date of Patent: Jul. 23, 1996

[54] METHOD AND SYSTEM FOR MEASURING THE DIFFUSION TENSOR AND FOR DIFFUSION TENSOR IMAGING

[75] Inventors: Peter J. Basser, Washington, D.C.; James H. Mattiello, Falls Church, Va.; Denis LeBihan, Rockville, Md.

[73] Assignee: The United States of America as represented by the Department of Health and Human Services, Washington, D.C.

[21] Appl. No.: 511,920

[22] Filed: Aug. 7, 1995

Related U.S. Application Data

[63] Continuation of Ser. No. 103,009, Aug. 6, 1993, abandoned.

[51] Int. Cl.$^6$ .................................................. G01R 33/20
[52] U.S. Cl. ................................................ 324/307; 324/309
[58] Field of Search ................................ 324/309, 307, 324/300, 314, 315, 312, 313, 318, 322; 128/653.2

[56] References Cited

U.S. PATENT DOCUMENTS

| Re. 33,391 | 10/1990 | Breton et al. | 324/309 |
|---|---|---|---|
| 4,719,423 | 1/1988 | Vinegar et al. | 324/303 |
| 4,780,674 | 10/1988 | Breton et al. | 324/309 |
| 4,809,701 | 3/1989 | Le Bihan et al. | 128/653 |
| 4,914,608 | 3/1990 | Le Bihan et al. | 324/315 |
| 5,065,097 | 11/1991 | Nozokido et al. | 324/309 |
| 5,092,335 | 3/1992 | Le Bihan | 324/309 |
| 5,235,276 | 8/1993 | Lew | 324/306 |
| 5,317,262 | 5/1994 | Moonen et al. | 324/306 |

OTHER PUBLICATIONS

"Molecular Diffusion Nuclear Magnetic Resonance Imaging", Magnetic Resonance Quarterly, vol. 7, No. 1, pp. 1–30, 1991, D. LeBihan.

"Spin Diffusion Measurements: Spin Echoes in the Presence of a Time–Dependent Field Gradient"; J. Chem. Physics, vol. 42, No. 1, pp. 288–292, 1965, E. O. Stejskal, J. E. Tanner.

"Use of Spin–Echoes in a Pulsed Magnetic Field Gradient to Study Anisotropic, Restricted Diffusion and Flow", J. Chem. Physics, vol. 43, No. 10, pp. 3597–3603, 1965, E. O. Stejskal.

Thomas C. Farrar and Edwin D. Becker Pulse and Fourier Transform NMR, Introduction to Theory and Methods, Chapter 7, pp. 100–110 (1971).

Wesley T. Huntress, Jr., A Nuclear Resonance Study of Anisotropic Molecular Rotation in Liquid Chloroform and in Chloroform–Benzene Solution, NMR Study of Anisotropic Molecular Rotation, vol. 75, pp. 103–111 No. 1 (Jan. 1969).

G. G. Cleveland, D. C. Chang, C. F. Hazlewood and H. E. Rorschach, Nuclear Magnetic Resonance Measurement of Skeletal Muscle, Biophysical Journal, vol. 16, pp. 1043–1053 (1976).

Phillipe Douek, Robert Turner, James Pekar, Nicholas Patronas and Denis LeBihan, MR Color Mapping of Myeline Fiber Orientation, Journal of Computer Assisted Tomograph 15(6)–923–929, Nov.–Dec. (1991).

(List continued on next page.)

Primary Examiner—Sandra L. O'Shea
Assistant Examiner—Raymond Mah
Attorney, Agent, or Firm—Morgan & Finnegan

[57] ABSTRACT

A method and system for measuring the effective diffusion tensor for spin labeled particles, and generating images therefrom. The effective diffusion tensor is related to the echo intensity in an NMR spin-echo experiment. This relationship is used to design experiments from which the diffusion tensor components are estimated. Estimation of Deff provides the theoretical basis for a new MRI modality, diffusion tensor imaging. Diffusion ellipsoids may be used for generating images representative of physical characteristics of the observed object. Scalar invariants of the diffusion tensor are also used for imaging.

35 Claims, 9 Drawing Sheets

OTHER PUBLICATIONS

L. Garrido, U. M. Spencer, K. K. Kwong, V. J. Wedeen, HL Kantor, Molecular diffusion to determine muscle fiber ] orientation: in vitro studies in perfused hearts. Presented at the 10th Annual Meeting of the Society of Magnetic Resonance in Medicien; Aug. 10–16, 1991, San Francisco, CA.

P. J. Basser, D. LeBihan, 1992, Fiber orientation mapping in an anisotropic medium and NMR diffusion spectroscopy, PRoc. SMRM, Berline, 1:1221, Aug. 8, 1992.

P. J. Basser, J. Mattiello, D. LeBihan, Aug., 1992, Diagonal and off–diagonal components of the self–diffusion tensor; their relation to and estimation from the NMR spin–echo, Proc. SMRM, Berline, 1:1222, Aug. 8, 1994–2.

METHOD AND SYSTEM FOR MEASURING THE DIFFUSION TENSOR AND FOR DIFFUSION TENSOR IMAGING

This is a continuation of application Ser. No. 08/103,009, filed on Aug. 6, 1993, (now abandoned).

BACKGROUND OF THE INVENTION

The present invention relates generally to nuclear magnetic resonance and, more particularly, to a method and a system for measuring the diffusion tensor and for generating images related thereto.

Conventional nuclear magnetic resonance (NMR) has long been used for structural studies and compound identification based on the sensitivity of NMR parameters to the local chemical environment and to molecular mobilities. Further, conventional magnetic resonance imaging (MRI) is also well established as a technique for elucidating structure where it is used, for example, to discriminate between normal and pathological tissue. Such contrast depends on differences in parameters such as the proton density, the longitudinal relaxation time $T_1$, and the transverse relaxation time $T_2$ for different media. MRI has further been extended to imaging in which parameters such as the magnitude and phase of the tranverse magnetization, the magnitude of the longitudinal magnetization, and the resonance frequency are related to functions such as molecular displacements (e.g., flow and diffusion). One application, spectroscopic imaging techniques, provide a means for studying the spatial concentration of metabolites.

In another technique, diffusion NMR spectroscopy, a scalar diffusivity parameter is measured. The scalar diffusivity, D, which appears in Fick's first law, relating the concentration gradient of a spin-labeled species, $\nabla C$, and its flux, J (i.e., $J=-D\nabla C$) in water and other isotropic media, has been measured accurately using NMR spin-echo (H. Y. Carr, and E. M. Purcell, Phys. Rev., 94, 630, (1954); E. L. Hahn, Phys. Rev., 80, 580, (1950).) and pulsed-gradient spin-echo (E. O. Stejskal, and J. E. Tanner, J. Chem. Phys., 42, 288, (1965)) sequences. This modality exploits the random nature of molecular motion of the spin labeled species in diffusion which induces a phase dispersion resulting in the attenuation of the signal amplitude. The scalar self-diffusivity can be estimated from the linear relationship between the logarithm of the echo intensity and the square of the magnitude of the magnetic field gradient in which D appears as a constant of proportionality (See supra, Carr and Purcell; E. O. Stejskal, and J. E. Tanner, J. Chem. Phys., 42, 288, (1965). Recently, diffusion NMR spectroscopy and Fourier NMR imaging were combined (D. G. Taylor, and M. C. Bushell, Phys. Med. Biol., 30, 345, (1985); K. D. Merboldt et al., J. Magn. Reson., 64, 479, (1985); D. LeBihan, and E. Breton, Cr. Acad. Sci. (Paris), 301, 1109, (1985)) by combining a diffusion spectroscopy sequence with an imaging sequence, permitting an effective scalar diffusivity, $D^{eff}$, to be estimated in each voxel of an image (D. LeBihan, Magn. Res. Quart., 7, 1, (1991)).

In contrast to isotropic media, one observes significantly different effective diffusion constants in anisotropic media when magnetic field gradients are applied in different directions. For instance, in diffusion NMR spectroscopy and imaging of anisotropic tissue like brain white matter (M. E. Moseley et al., Radiology, 176, 439, (1990)) or skeletal muscle (G. G. Cleveland et at., Biophys. J., 16, 1043, (1976)), the observed echo intensity depends on the specimen's orientation with respect to the direction of the applied magnetic field gradient. This orientation dependence of diffusion can be described by a generalized Fick's law (i.e., $J=-D^{eff}\nabla C$) in which $D^{eff}$ is an effective diffusion tensor.

While its use has been suggested in NMR spectroscopy (See supra, Stejskal, and J. E. Tanner, (1965)) and imaging (See supra, LeBihan; R. Turner et al., Radiology, 177, 407, (1990)), an explicit relationship between the effective diffusion tensor and the NMR signal has not been elucidated. Moreover, no method has been proposed to measure the off-diagonal elements of $D^{eff}$. Although differences among $D^{eff}$'s diagonal elements are a necessary condition to demonstrate anisotropic diffusion, all diagonal and off-diagonal elements of $D^{eff}$ must be known to characterize diffusion adequately, specifically; to infer the mean microscopic displacements of the labelled species.

Thus, it would be advantageous to develop additional NMR measurement and imaging modalities based on the effective diffusion tensor.

Accordingly, an object of the present invention is to provide a new NMR modality to measure the effective diffusion tensor for spin-labelled species.

A related object of the present invention is to relate the effective diffusion tensor to physical characteristics of the observed sample.

Yet a further object of the present invention is to provide new MRI imaging modalities that use information contained in the diffusion tensor.

The foregoing specific objects and advantages of the invention are illustrative of those which can be achieved by the present invention and are not intended to be exhaustive or limiting of the possible advantages which can be realized. Thus, these and other objects and advantages of the invention will be apparent from the description herein or can be learned from practicing the invention, both as embodied herein or as modified in view of any variations which may be apparent to those skilled in the art.

SUMMARY OF THE INVENTION

The above objects and advantages are achieved by a method and system for measuring the effective diffusion tensor for spin-labelled nuclei. A relationship is derived between the echo attenuation by diffusion and the diffusion tensor. Based on this relationship, an NMR apparatus is controlled by a pulse sequence for generating NMR signals from which the diffusion tensor can be calculated. Functional quantities related to the diffusion tensor may be imaged. The diffusion tensor may be used for generating a diffusion ellipsoid for the measured region. The diffusion ellipsoid may be related to the microstructure of the medium, and a spatial image of diffusion ellipsoids provides a representation of local anisotropy. Such techniques may be used for imaging fiber orientation in tissue. Eigenvectors and the related eigenvalues of the diffusion tensor correspond to the medium's three orthotropic axes and related diffusivities, respectively. Scalar invariants associated with the diffusion tensor may be related to other functional characteristics within each voxel, such as the orientation independent mobility and microstructure, and corresponding spatial images may be generated. Further, measurement of the diffusion tensor may be employed for aligning and calibrating the magnetic field gradients of the NMR apparatus itself.

BRIEF DESCRIPTION OF THE DRAWINGS

The invention will be described in greater detail below by way of reference to the accompanying drawings, wherein.

DETAILED DESCRIPTION OF THE PREFERRED EMBODIMENT

Figure 1:
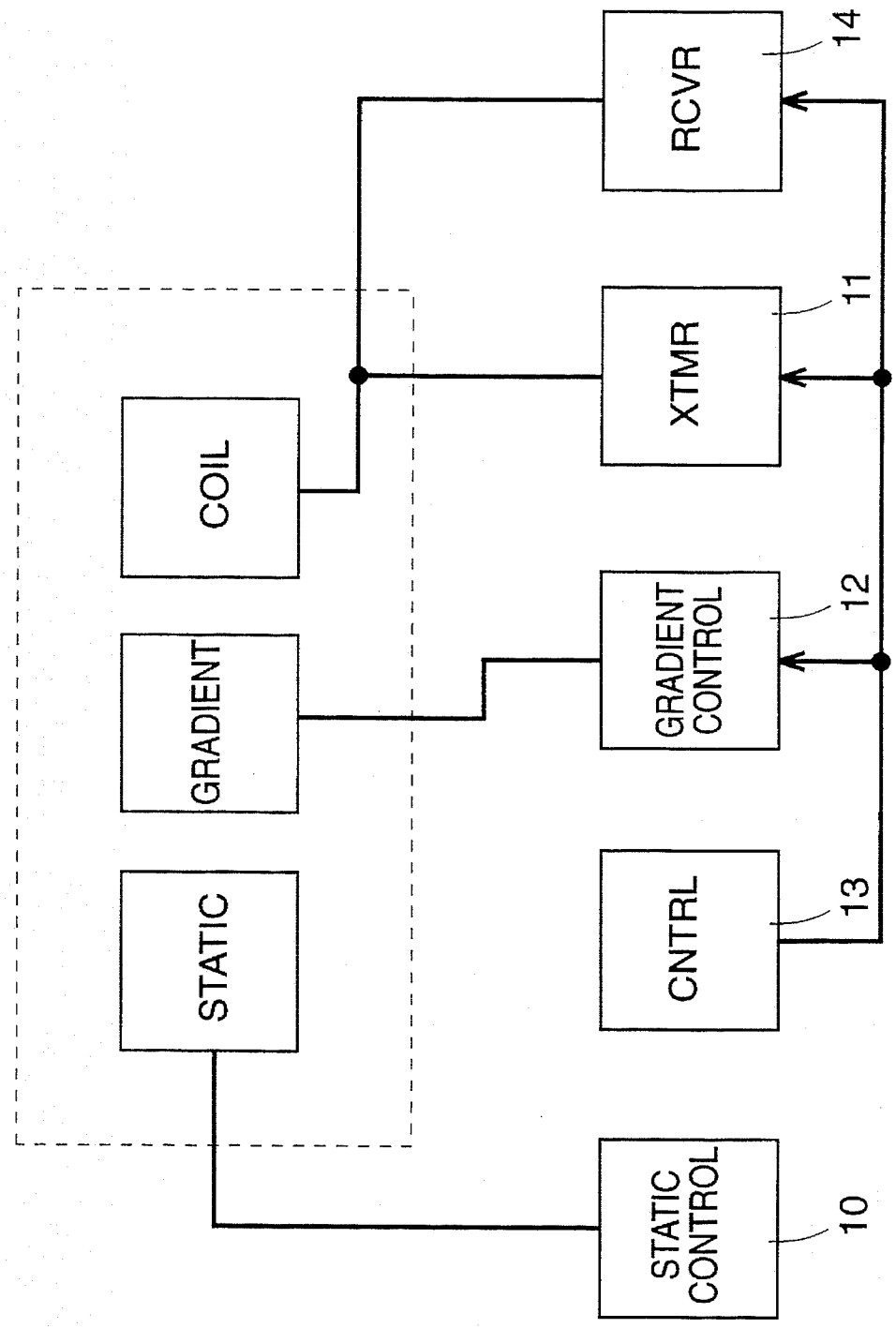
FIG. 1 is a functional block diagram of a nuclear magnetic resonance apparatus used in conjunction with the present invention.

Referring now to the accompanying drawings, wherein like reference characters refer to like parts throughout the various views, there are shown in FIGS. 1–8 the preferred embodiments of the system and method for estimating the diffusion tensor, and for generating images based on the components of the diffusion tensor, according to the present invention. Features of the present invention have been described in the literature. All references cited herein are incorporated by reference.

The present invention is intended for use with a conventional NMR apparatus, such as the one depicted in FIG. 1. The typical NMR apparatus shown in FIG. 1 includes a main magnetic field means 10 for generating a substantially uniform static magnetic field through an image region. A radio frequency means 11 selectively transmits radio frequency excitation pulses for generating magnetic resonance of selected nuclei within the image region. Further, the radio frequency means 11 may be used for selectively rotating selected components of the 14 magnetization through selected angles. A gradient field means 12 selectively applies gradient fields, preferably along three orthogonal axes across the image region. A pulse sequence control means 13 controls the radio frequency means 11 and the gradient field means 12 to cause the generation of predetermined pulse sequences. A radio frequency receiver means 14 receives the magnetic resonance data. A processor means 15 stores and processes the acquired data, and may be used for controlling the pulse sequence control means 13. In accordance with the present invention, an NMR apparatus is adapted to operate in order to acquire data which may be used to determine the effective diffusion tensor.

The hereinbelow detailed description sets forth preferred embodiments for practicing the invention. First an analytic expression is derived which relates the effects of anisotropic diffusion on the NMR signal in imaging and spectroscopy by relating the diagonal and off-diagonal elements of $D^{eff}$ to the measured echo intensity for a pulsed-gradient experiment. Based on this relationship, a series of magnetic field gradient sequences are designed that permit observation of different linear combinations of these diagonal and off-diagonal elements of $D^{eff}$ on the measured echo. Preferably, in order to assess their respective significance, a statistical approach is used for estimating the components of the diffusion tensor in a voxel from the measured intensity, by treating the components as free parameters. In further embodiments of the present invention, the estimated diffusion tensor may be applied to imaging microstructure, to imaging microscopic displacements of labeled particles, and to correct for crosstalk, misalignment and maladjustment of magnetic gradient coils. Several examples illustrate applications of the present invention.

EFFECTIVE DIFFUSION TENSOR

The effective second-order diffusion tensor, $D^{eff}$, relates the macroscopic concentration gradient, $\nabla C$, and the macroscopic diffusive flux, $J$, in an anisotropic medium according to the relation $J = -D^{eff} \nabla C$. In component format, this equation is expressed as:

$$\begin{bmatrix} J_x \\ J_y \\ J_z \end{bmatrix} = - \begin{bmatrix} D^{eff}_{xx} & D^{eff}_{xy} & D^{eff}_{xz} \\ D^{eff}_{yx} & D^{eff}_{yy} & D^{eff}_{yz} \\ D^{eff}_{zx} & D^{eff}_{zy} & D^{eff}_{zz} \end{bmatrix} \begin{bmatrix} \frac{\partial C}{\partial x} \\ \frac{\partial C}{\partial y} \\ \frac{\partial C}{\partial z} \end{bmatrix} \quad (1)$$

Diagonal elements of $D^{eff}$ scale fluxes and concentration gradients in the same direction; off-diagonal elements couple fluxes and concentration gradients in orthogonal directions. One important consequence of equation (1) is that the concentration gradient is not necessarily parallel to diffusive flux, as in isotropic media. For uncharged moieties such as water, $D^{eff}$, is symmetric, a consequence of the reciprocity theorem, and the principle of microscopic reversibility of nonequilibrium thermodynamics.

One operational assumption made in accordance with the present invention, is that the components of the effective diffusion tensor are macroscopic, voxel-averaged quantities that are not explicit functions of time but may vary among voxels and other pulse parameters.

RELATING THE NMR SIGNAL TO $D^{eff}$

In order to measure the effective diffusion tensor, a formula is required which relates an NMR signal to the diffusion tensor. In accordance with a preferred embodiment of the present invention, a relationship is derived between the echo intensity in a spin-echo pulsed-gradient NMR experiment and the effective diffusion tensor for a sample under observation. However, this relationship can also be established for MR signals not based on spin-echoes, (D. LeBihan, Magn. Res. Quart., 7, 1, (1991)).

The solution to the Bloch Equations (F. Bloch, Phys. Rev., 70, 460, (1946)) with diffusion (H. C. Torrey, Phys. Rev., 104, 563, (1956)) in a 90°–180° spin-echo, pulsed-gradient experiment is well known, as is the modification of Stejskal that makes them amenable to describing free diffusion in an anisotropic medium (E. O. Stejskal, J. Chem. Phys., 43, 3597, (1965)). Stejskal related the applied magnetic gradient vector, G(t), $$G(t) = [G_x(t), G_y(t), G_z(t)]^T \quad (1)$$

and its time integral, $$F(t) = \int_0^t G(t')dt' \quad (3)$$

to the echo intensity, A(TE), in a spin-echo experiment according to:

$$\frac{A(TE)}{A(0)} = \exp\left(-\gamma^2 \int_0^{TE} \left(F(t') - 2H\left(t' - \frac{TE}{2}\right)f\right) \underline{D} \left(F(t') - 2H\left(t' - \frac{TE}{2}\right)f\right) dt'\right) \quad (4)$$

Above, γ is the gyromagnetic ratio of the spin labeled species, A(0) is the echo intensity with no applied gradients, H(t') is the unit Heaviside function, TE is the echo time, and f=F(TE/2).

By analogy with the definition of the scalar effective diffusion coefficient (J. E. Tanner, J. Chem. Phys., 69, 1748, (1978)), in the present invention an effective diffusivity tensor is defined, $D^{eff}$, as a mean value of the exponent in equation 4, over the time interval [0, TE]:

$$\gamma^2 \int_0^{TE} \left(F(t') - 2H\left(t' - \frac{TE}{2}\right)f\right) \left(F(t') - 2H\left(t' - \frac{TE}{2}\right)f\right)^t dt' : \underline{D}^{eff} = \quad (5)$$

$$\gamma^2 \int_0^{TE} \left(F(t') - 2H\left(t' - \frac{TE}{2}\right)f\right)^T D \left(F(t') - 2H\left(t' - \frac{TE}{2}\right)f\right) dt'$$

where ":" is the generalized dot product. Taking the logarithm of equation (4), and using the definition of $D^{eff}$, equation (5), yields:

$$\ln\left(\frac{A(TE)}{A(0)}\right) = -\sum_{i=1}^{3}\sum_{j=1}^{3} b_{ij} D_{ij}^{eff} = -\underline{b} : \underline{D}^{eff} \quad (6)$$

The importance of equation (6) is that it establishes a linear relationship between the logarithm of the echo attenuation, ln(A(TE)/A(0)), and each component of $D^{eff}$. Above, $b_{ij}$ is $ij^{th}$ component of a symmetric matrix, b, defined as:

$$\underline{b} = \gamma^2 \int_0^{TE} \left(F(t') - 2H\left(t' - \frac{TE}{2}\right)f\right) \left(F(t') - 2H\left(t' - \frac{TE}{2}\right)f\right)^T dt' \quad (7)$$

The b-matrix performs the role in anisotropic diffusion that the scalar b-factor (i.e., the coefficient of the scalar diffusion constant) performs in isotropic diffusion. The diagonal elements of $b_{ij}$ subsume all interactions between diffusion and imaging gradient pulses in the same direction which are referred to as "cross-terms" while the off-diagonal elements of $b_{ij}$ couple imaging and/or diffusion gradients in orthogonal directions.

Although the foregoing derivation was performed for a 90°–180° spin-echo pulsed-gradient experiment, it is understood that relationships between the diffusion tensor and observable signal parameters may be derived or calculated for other pulse experiments in accordance with the teachings of the present invention, and expressed in the form of equation (6).

MR signals used for diffusion measurements may be in the form of an echo (e.g., spin-echo, stimulated-echo, or gradient-recalled echo), or FID (free-induction decay). This signal can be encoded by different means to provide localizaton, i.e., imaging,(D. LeBihan, Magn. Res. Quart., 7, 1, (1991)).

NMR PULSE SEQUENCES

In accordance with the present invention, based on a relationship derived between the diffusion tensor and the signal generated by the labeled particles, the pulse sequences, which induce a signal from the labeled particles, are derived such that the components of the diffusion tensor may be estimated from the measured signal. In the preferred embodiment, equation (6) suggests that experiments can be designed to observe different linear combinations of the components of $D^{eff}$ by applying diffusion gradients in different directions.

For example, in NMR diffusion spectroscopy, to observe the echo attenuation caused only by $D^{eff}$, a gradient pulse sequence may be chosen in which G has a component only in the x direction, so that only $b_{11}=b_{xx}$ is not equal to zero. When this is the case:

$$\ln\left(\frac{A(b)}{A(0)}\right) = -b_{xx} D_{xx}^{eff} \quad (8)$$

Alternatively, to observe the echo attenuation caused by all of the components of $D^{eff}$ simultaneously (its diagonal and off-diagonal components), all of the components of G can be chosen to be non-zero, so that (assuming $D_{ij}^{eff}=D_{ji}^{eff}$, and $b_{ij}=b_{ji}$):

$$\ln\left(\frac{A(b)}{A(0)}\right) = -(b_{xx}D_{xx}^{eff} + b_{yy}D_{yy}^{eff} + b_{zz}D_{zz}^{eff} + \quad (9)$$

$$(b_{xy}+b_{yx})D_{xy}^{eff} + (b_{xz}+b_{zx})D_{xz}^{eff} + (b_{yz}+b_{zy})D_{yz}^{eff}).$$

Evidently, in order to calculate the six independent components of the diffusion tensor (i.e., assuming the diffusion tensor is symmetric) as well as the unknown A(0), a set of gradient pulse sequences must be applied in a minimum of seven noncolinear directions. Alternatively, a set of gradient pulse sequences may be applied in only six noncolinear directions, and A(0) may be determined by an trial where G=0.

Moreover, for gradient pulse sequences commonly used in diffusion spectroscopy (e.g., rectangular, sinusoidal, triangular, trapezoidal, etc.), simple analytic expressions can be derived for each matrix element, $b_{ij}$. For example, for symmetric trapezoidal pulses like those shown in FIG. 2, $$b_{ij} = \gamma^2 G_i G_j \left( \delta^2 \left( \Delta - \frac{\delta}{3} \right) + \frac{\epsilon^3}{30} - \frac{\delta\epsilon^2}{6} \right). \tag{10}$$

Figure 2:
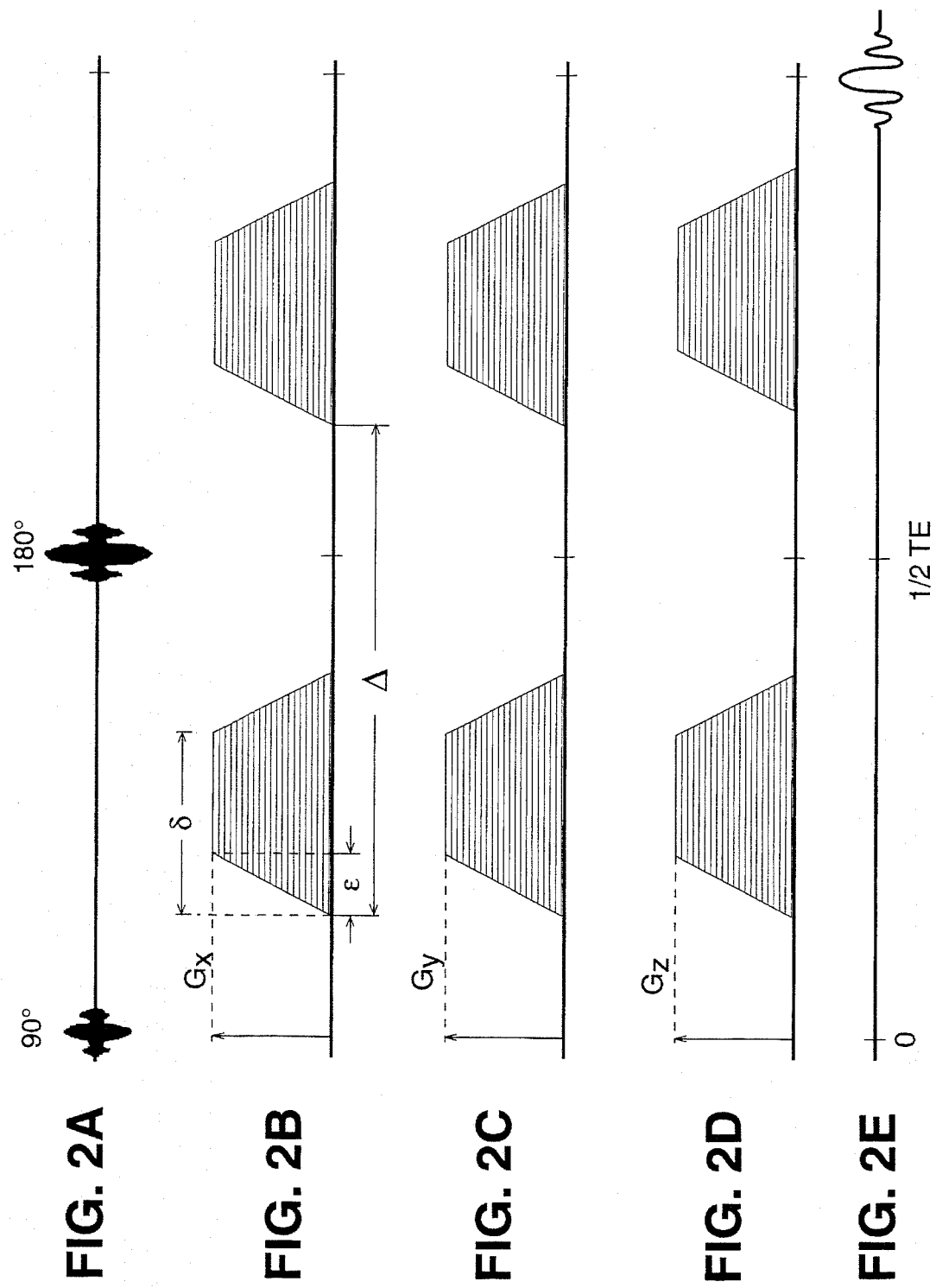
FIGS. 2A–2E depict a pulse sequence used for a pulsed-gradient spin-echo NMR diffusion spectroscopy experiment, in accordance with the present invention.

As shown in FIG. 2, $\delta$ is the time between the initial rise of a trapezoidal pulse and the end of its plateau; $\Delta$ is the time between the initial rise of the first and second pulses; $\epsilon$ is the rise time of the ramp; and $G_i$ is the maximum field gradient along the $x_i$ coordinate direction. So by substituting equation (10) into equation (6), a theoretical relationship may be derived between the echo attenuation, $A(b)$, (which is now written as $A(G)$ and $D^{eff}$:

$$\ln\left(\frac{A(G)}{A(0)}\right) = -\gamma^2 \left( \delta^2 \left( \Delta - \frac{\delta}{3} \right) + \frac{\epsilon^3}{30} - \frac{\delta\epsilon^2}{6} \right) G^T \underline{D}^{eff} G \tag{11}$$

The quadratic form in equation 11 reduces to a familiar expression when the medium is isotropic with diffusivity $D_0$:

$$\ln\left(\frac{A(G)}{A(0)}\right) = \tag{12}$$

$$-\gamma^2 |G|^2 \left( \delta^2 \left( \Delta - \frac{\delta}{3} \right) + \frac{\epsilon^3}{30} - \frac{\delta\epsilon^2}{6} \right) D_0 = -bD_0,$$

a degenerate case of equation (11) for which the scalar b-factor has already been derived (22, 23).

It is understood that although the foregoing derivation for NMR diffusion spectroscopy pulse sequences is based on a 90°–180° spin-echo pulsed-gradient spectroscopy sequence, that analogous relationships between the diffusion tensor and observable signal parameters may be derived or calculated for other pulse sequences. Similarly, expressions for the b matrix parameters may be derived or calculated for other pulse shapes. As stated hereinabove, MR signals used for diffusion measurements may be in the form of an echo (e.g., spin-echo, stimulated-echo, or gradient-recalled echo), or FID (flee-induction decay). This signal can be encoded by different means to provide localizaton, i.e., imaging. Such relationships may also be used for experimentally determining the diffusion tensor and for using the information found in the diffusion tensor in accordance with the present invention.

Figure 3:
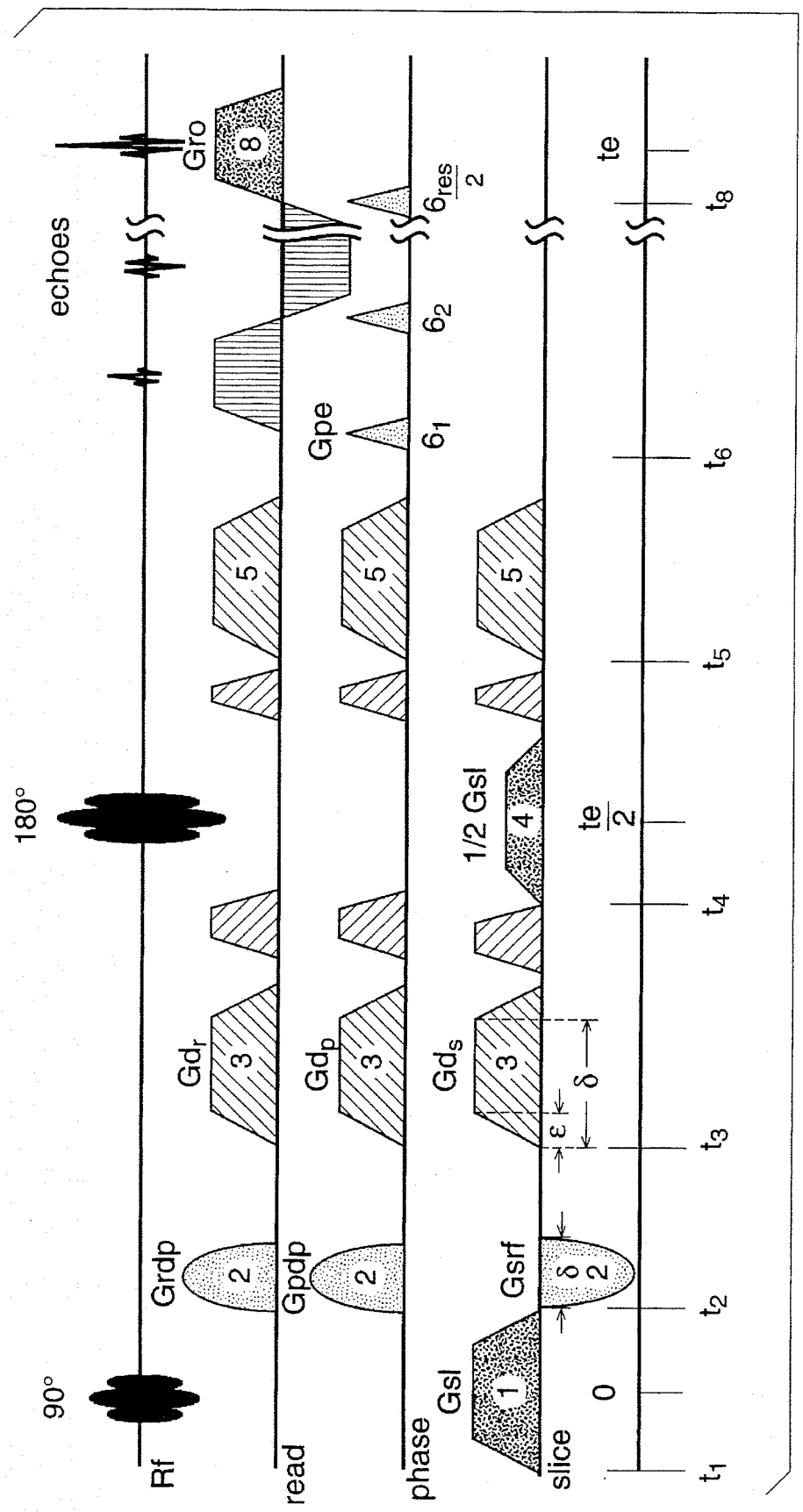
FIG. 3 shows an echo-planar imaging pulse sequence used to acquire NMR diffusion tensor images, in accordance with the present invention.

For diffusion tensor imaging, a diffusion gradient pulse sequence is embedded into an imaging pulse sequence such that a data set will be acquired which provides information for calculating a plurality of diffusion tensors for a respective plurality of voxels or sub-regions which constitute the imaged region. The imaging pulse sequence may be one of many types used for MRI. For instance. FIG. 3 shows an echo-planar image pulse sequence which includes a diffusion gradient. As in conventional imaging, the image pulse sequence samples k-space, and the acquired data set is transformed into an spatial intensity image; however, the addition of the diffusion gradient pulse sub-sequence results in a diffusion weighted image. As for NMR diffusion spectroscopy, the embedded diffusion gradient pulses should be applied in a minimum of seven noncolinear directions. Alternatively, a set of diffusion gradient pulses may be applied in only six noncolinear directions, and $A(0)$ may be determined by an trial where $G=0$. For each signal acquisition, a new diffusion weighted image is created. Since the imaging subsequence also affects the phase information, the b matrix elements for each voxel generally cannot be reduced to a single analytical expression as derived above for NMR diffusion spectroscopy. Thus, for each image, the b-matrix elements for each voxel are generally calculated analytically, off-line according to equation (7) accounting for the entire pulse sequence (i.e.,) both the imaging pulse sequence and the imaging pulse sequence). (P. J. Basser et al., Proc. SMRM, Berlin, 1, 1221–1222 (1992); J. Mattiello et al., Proc. SMRM, New York, (1993)).

ESTIMATION OF THE DIFFUSION TENSOR

As described, pulse sequences for inducing a signal are generated such that the diffusion tensor components can be calculated according to the derived relationship between the observed signal and the diffusion tensor. If there were no error in measuring the echo intensity, in principle, for both diffusion spectroscopy and diffusion tensor imaging pulse sequences, the six independent elements of the diffusion tensor and $A(0)$ could be determined using only seven independent trials (i.e., one trial for each of seven noncolinear directions of G) by simply inverting a 7×7 matrix constructed from equation (6). For diffusion tensor imaging, the seven independent trials for the diffusion gradient pulses are embedded in the imaging pulse sequence, and a 7×7 matrix is inverted for each voxel. Since measurements of echo intensity are usually noisy, this approach generally provides poor estimates of $D^{eff}$. Thus, in the preferred embodiment, a larger number of trials than seven are performed, and in order to estimate $D^{eff}$ statistically, multivariate regression is employed. In doing so, off-diagonal components of $D^{eff}$ are not neglected a priori. Instead, all components of $D^{eff}$ are assumed to contribute to the measured echo intensity. Then, once each component of $D^{eff}$ has been estimated, its relative importance can be assessed.

In a preferred embodiment corresponding to diffusion spectroscopy, echo intensities are measured for a series of symmetric, trapezoidal gradient pulse sequences in which magnetic field gradients are applied in at least seven non-collinear directions. The optimal $D^{eff}$ minimizes the sum of the squares of the differences between measured and theoretically predicted spin-echo intensities. For diffusion tensor imaging, the estimation of the diffusion tensor for each voxel procedes in similar fashion to that herein described for diffusion spectroscopy; however, the larger number of trials is established by generating a plurality of diffusion weighted images.

In general, in each experiment, n noncollinear gradient directions are chosen, for which m measurements of $A(G)$ are made at different gradient strengths. These n×m observations of $\ln(A(G))$ are stored as a nm×1 column vector, x. Another column vector, $\alpha$, is defined which contains the parameters to be estimated, and therefore has seven elements—the six diffusion coefficients and $\ln(A(0))$, and is expressed as:

$$\alpha = [D_{xx}^{eff}, D_{yy}^{eff}, D_{zz}^{eff}, D_{xy}^{eff}, D_{xz}^{eff}, D_{yz}^{eff}, \ln[A(0)]]^T \tag{13}$$

Next, a nm×1 column vector of predicted outcomes, x, is defined as the product of an nm×7 matrix of b-factors, B, computed from equation (11), and $\alpha$:

$$\xi = B\alpha \tag{14}$$

The chi-squared parameter, $\chi^2(\xi)$, defined as:

$$\chi^2(\xi) = (x-\epsilon)^T \Sigma^{-1} (x-\xi) \tag{15}$$

is the weighted sum-of-squares of deviations between the observed and predicted echo intensities. For each of the m×n independent trials, the squared deviation is weighted by the corrected reciprocal error variance for that measurement:

$x_i^2/\sigma_{ii}^2$ that become the diagonal elements of the covariance matrix, $\Sigma^{-1}$. They account for the expected variation in each trial, and correct for the distortion introduced by the logarithmic transformation of $A(G)/A(0)$ (25).

Minimizing $\chi^2(\xi)$ with respect to each of the seven unknown parameters in $\xi$ yields seven linear (normal) equations, which in matrix form are:

$$(B^T\Sigma^{-1}B)\alpha_{opt}=(B^T\Sigma^{-1})x \qquad (16)$$

The optimal parameters, $\alpha_{opt}$, are:

$$\alpha_{opt}=(B^T\Sigma^{-1}B)^{-1}(B^T\Sigma^{-1})x=M^{-1}(B^T\Sigma^{-1})x \qquad (17)$$

The first term on the right-hand side of equation (17), $(B^T\Sigma^{-1})^{-1}=M^{-1}$, is a 7×7 matrix, the diagonal elements of which are the error variances of the seven estimated parameters.

Thus, the problem of determining the components of the effective diffusion tensor is reduced to a routine problem in multivariate linear regression: solving seven linear (normal) equations simultaneously for seven unknown parameters.

DIFFUSION TENSOR SPECTROSCOPY AND IMAGING

Once the diffusion tensor has been estimated for a given voxel, this information may be used in myriad ways in order to express physical, chemical, structural, and physiological characteristics within the voxel, and preferably is expressed visually in the form of a graph or an image. For instance, using the effective diffusion tensor, in each voxel, images of diffusion ellipsoids and scalar invariants of $D^{eff}$ can be constructed which can reveal important information about the observed matter, including microstructural features, functional parameters, and physiological information for living matter. In diffusion tensor spectroscopy, information found in a single diffusion tensor corresponding to a single region or voxel is represented. In the hereinabove described diffusion tensor imaging technique, the information found in a plurality of diffusion tensors corresponding to a respective plurality of voxels is represented.

For each estimated $D^{eff}$, whether it is measured for an entire tissue sample, or for an individual voxel, a three dimensional surface may be constructed which graphically represents information contained in the diffusion tensor. Preferably, such a construction shows the orthogonal coordinate axes (the principal coordinate axes) along which diffusive fluxes and concentration gradients are locally uncoupled. Moreover, the three corresponding diffusion coefficients in these principal directions (principal diffusivities) may be calculated. Because $D^{eff}$ is symmetric and positive definite, its three orthogonal eigenvectors (principal coordinate directions) $\epsilon_1$, $\epsilon_2$, and $\epsilon_3$, are related to its three corresponding positive eigenvalues (principal effective diffusivities), $\lambda_1$, $\lambda_2$, and $\lambda_3$, by:

$$D^{eff}\epsilon_i=\lambda_i\epsilon_i \text{ for } i=\{1,2,3\}. \qquad (18)$$

The three equations in equation (18) can be rewritten in matrix form as:

$$\underline{D}^{eff}\underline{E}=\underline{E}\,\underline{\Lambda} \text{ with } \underline{E}=(\epsilon_1|\epsilon_2|\epsilon_3) \text{ and } \underline{\Lambda}=\begin{pmatrix} \lambda_1 & 0 & 0 \\ 0 & \lambda_2 & 0 \\ 0 & 0 & \lambda_3 \end{pmatrix} \qquad (19)$$

where $\Lambda$ is the diagonal matrix of eigenvalues and E is the matrix of orthonormal eigenvectors, arranged in columns.

In ordered structures such as brain white matter and skeletal muscle, the anisotropy described by $D^{eff}$ at macroscopic (voxel) length scales is due to microscopic heterogeneity—most likely, to ordered semi-permeable membranes that retard diffusion (Douek et al., J. Comput. Assist. Tomogr. 15:923–929 (1991)). In anisotropic fibrous tissues, the principal directions of $D^{eff}$ must coincide with the orthotropic directions of the tissue. In particular, the eigenvector associated with the largest eigenvalue (diffusivity) should coincide with the tissue's fiber-tract axis, while the two remaining eigenvectors perpendicular to it, should define the two remaining orthotropic axes.

Clearly, the effective diffusion tensor, $D^{eff}$, inherently contains more information than a scalar variable. Preferably, some of which may be represented graphically by a diffusion ellipsoid.

Since molecular diffusion in anisotropic media may not only be described as a nonequilibrium transport process, but also as a Brownian random process, this latter model may be used in constructing and in interpreting a diffusion ellipsoid. In a Brownian random process, a conditional probability density function $p(x|x_0,t)$—the probability that a particle initially at $x_0$ at t=0 will reach position x at time t—describes the effective diffusion of protons in anisotropic media without convection:

$$p(x|x_0,\tau) = \frac{1}{\sqrt{|D^{eff}(\tau)|(4\pi\tau)^3}} \exp\left(\frac{-(x-x_0)^T\underline{D}^{eff^{-1}}(\tau)(x-x_0)}{4\tau}\right). \qquad (20)$$

In this model, $D^{eff^{-1}}(\xi)$ is the covariance matrix of $\rho(\chi|\chi_0,\tau)$. Above, $D^{eff}$ is assumed to be locally uniform; its components are measured in the laboratory frame. It is written as an explicit function of time because it may vary with the diffusion time or with the duration of the experiment. In tissue, equation (20) is valid strictly for very short diffusion times, until a significant number of protons encounter permeable barriers (J. E. Tanner, Journal of Chemical Physics, 69:1748–1754 (1978)).

Figure 4:
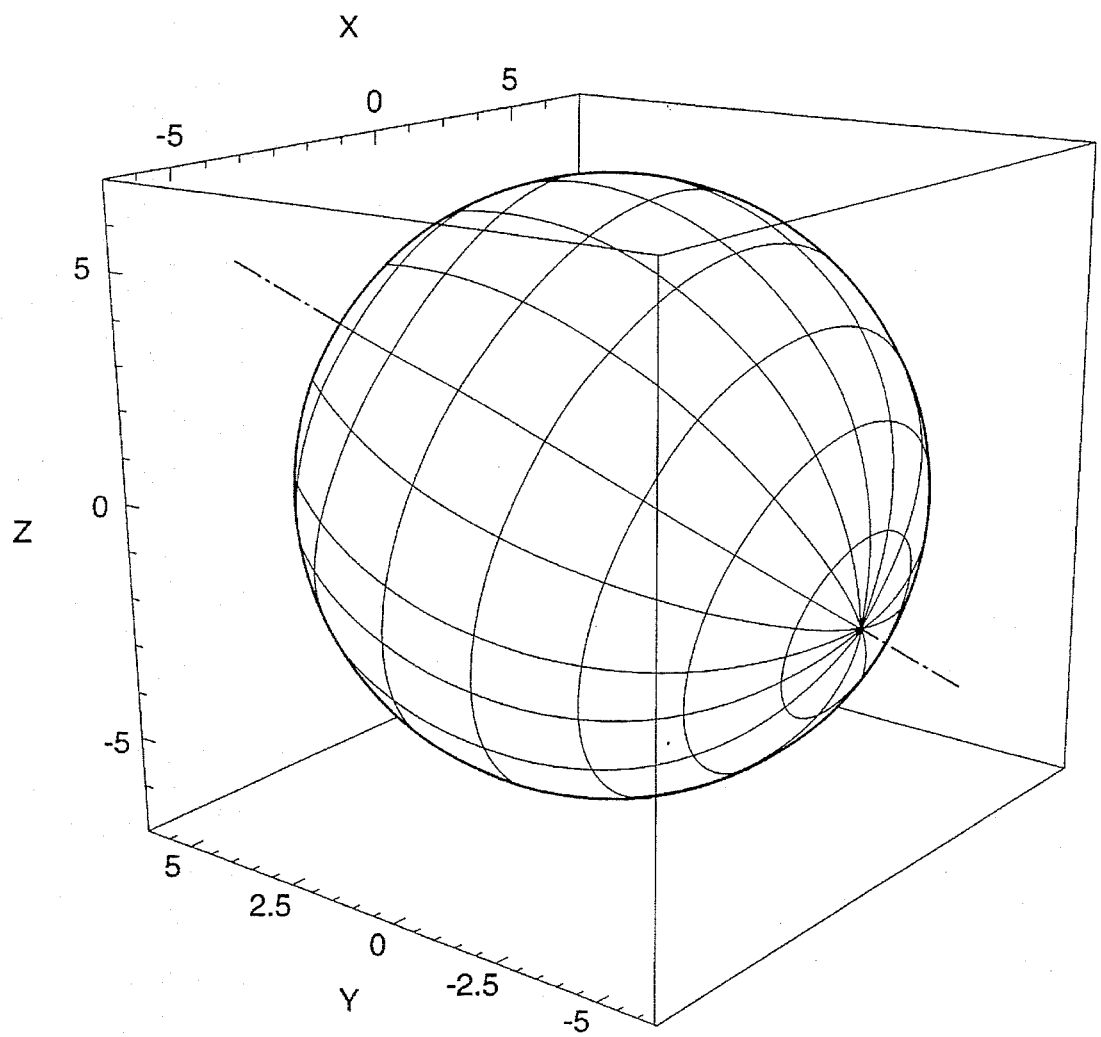
FIG. 4 illustrates a diffusion ellipsoid constructed in accordance with the present invention.

A diffusion ellipsoid, like the one shown in FIG. 4, by setting the quadratic form in the exponent of $\rho(x|x_0,\tau)$ in equation (20) to ½, i.e., $$\frac{(x-x_0)^T D^{eff^{-1}}(\tau)(x-x_0)}{2\tau} = 1 \qquad (21)$$

Physically, equation (21) defines a surface of constant mean particle concentration.

To interpret the shape and orientation of the ellipsoid, first the coordinates are transformed from the "laboratory" frame (x) to the "principal" (x') frame of reference for a particular voxel centered at $x_0$, using $$x'=E^T(x-x_o) \qquad (22)$$

As is known, E should have the properties of a coordinate transformation (e.g., det(E)=1. Then, using equations (22) and (19), the quadratic form in equation (21), becomes:

$$\frac{x'^T \Lambda^{-1} x'}{2\tau} = 1 \tag{23}$$

When expanded, the coordinates in equation (23) become decoupled:

$$\left(\frac{x'}{\sqrt{2\lambda_1 \tau}}\right)^2 + \left(\frac{y'}{\sqrt{2\lambda_2 \tau}}\right)^2 + \left(\frac{z'}{\sqrt{2\lambda_3 \tau}}\right)^2 = \tag{24}$$

$$\left(\frac{x'}{\sigma_1}\right)^2 + \left(\frac{y'}{\sigma_2}\right)^2 + \left(\frac{z'}{\sigma_3}\right)^2 = 1$$

The orthotropic directions are coincident with the principal axes of the ellipsoid, with the polar axis aligned with the fiber-tract directions. The lengths of the principal axes are the mean effective diffusion distances in the three principal (or orthotropic) directions during time, $\tau$. Therefore, the effective diffusion ellipsoid depicts both the fiber-tract direction and the mean diffusion distances.

It should be understood, however, that although the diffusion tensor is hereinabove described in the context of fiber-tract direction in ordered structures where it relates to the macroscopic anisotropy due to microscopic heterogeneity, the diffusion tensor may be related to microstructure in a variety of media. Further, in some materials, the diffusion tensor may be related to other physical characteristics or functions which may be modeled by alternative processes, and thus may be used to generate alternative surfaces for imaging these characteristics.

It is further understood that in certain applications, it may not be necessary to apply a gradient in one of the gradient directions. As a result, a 2×2 diffusion tensor is solved. For example, the sample may exhibit certain symmetry properties (e.g., parallel axes cylindrical fibers with azimuthal symmetry) and the orientation of the sample may be ascertained, and aligned to the magnetic field accordingly. Alternatively, even where there is no known symmetry, diffusion tensor imaging in a slice of the sample using gradients in only two dimensions may still provide useful information which may be represented in the form of a diffusion ellipse for each observed pixel. (P. J. Basser, et al., Proc. SMRM Workshop: Functional MRI of the Brain, Arlington, Va., 1993, p 224).

In accordance with a further embodiment of the present invention, scalar invariants of the diffusion tensor may be used for characterization and imaging. Associated with $D^{eff}$ are three scalar invariants, $I_1$, $I_2$, and $I_3$, that are intrinsic to the diffusion tensor in each voxel; they are functions only of the eigenvalues (principal diffusivities) of $D^{eff}$:

$$I_1 = \lambda_1 + \lambda_2 + \lambda_3 = TrD^{eff} = Tr\Lambda \tag{25}$$

$$I_2 = \lambda_1\lambda_2 + \lambda_3\lambda_1 + \lambda_2\lambda_3 \tag{26}$$

$$I_3 = \lambda_1\lambda_2\lambda_3 = |D^{eff}| = |\Lambda| \tag{27}$$

The scalar invariants, $I_1$, $I_2$, and $I_3$, and functions of them, are independent of the laboratory reference frame in which $D^{eff}$ is measured, and are insensitive to the scheme by which the eigenvalues of $D^{eff}$ are numbered. By normalizing each scalar invariant by the self-diffusivity of water, $D_w$, (at the known temperature of the sample) raised to the appropriate power each invariant can be compared to its value in free solution. For example, dimensionless scalar invariants can be defined as:

$$I_1' = \frac{I_1}{3D_w} \tag{28}$$

$$I_2' = \frac{I_2}{3D_w^2} \tag{29}$$

$$I_3' = \frac{I_3}{D_w^3} \tag{30}$$

Other dimensionless ratios of the eigenvalues, or functions of them, can be used to measure the degree of diffusion anisotropy. For example, the dimensionless anisotropy ration, $\lambda_2/\lambda_3$, measures the degree of rotational symmetry around the longest (e.g., fiber) axis (with $\lambda_2/\lambda_3=1$ indicating rotational symmetry), while $\lambda_1/\lambda_2$ and $\lambda_1/\lambda_3$ measure the relative magnitude of the diffusivities in the fiber and transverse directions. These anisotropy ratios are insensitive to the samples's orientation with respect to the (laboratory) x-y-z reference frame. They measure the ratio of the effective diffusivities both parallel to and perpendicular to the fiber tract directions, independent of the sample's placement and orientation within the magnet. This reflects the notion that an anisotropy ratio is a characteristic of the tissue, and as such, is independent of the sample's placement or orientation. Images can be generated based on any one of the scalar invariants (or a combination or a function of them), for a plurality of diffusion tensors corresponding to a respective plurality of voxels.

MAGNETIC FIELD GRADIENT ALIGNMENT AND GAIN CORRECTION

In a further embodiment of the present invention, measurement of the diffusion tensor may be used for magnetic field gradient alignment and gain correction. It is known that distortion of NMR images can be produced by many factors. Common sources of error are that the x, y, and z gradient coils may not be mutually orthogonal, or coincident with the laboratory frame of reference, or that the current that determines the magnitude field gradient may be different from what the NMR operator prescribes. One method to correct these errors is to image a well-characterized isotropic phantom, iteratively rebalancing the magnetic field gradient strengths until the image appears true to scale. However, from the Bloch equation, it is known that phase distortion in a particular direction only scales with the gradient strength in that direction [10]. Typically, this phase correction is not sufficient for NMR diffusion spectroscopy or imaging. However, as shown hereinabove, the estimated diffusion tensor can be used to correct for the three aforementioned sources of field gradient aberrations simultaneously, while being more sensitive (i.e., depending on the square of the field gradient). That is, the errors may be corrected by rebalancing the magnetic field gradient alignment and gain such that the estimated diffusion tensor is substantially equivalent to the known diffusion tensor for a sample under observation (i.e., a calibration sample or standard).

There are many ways such a method may be implemented. For instance, the technique may be used to physically align the gradient coils by, for example, adjusting set screws that adjust their orientation. The currents may also be adjusted physically by adjusting settings (e.g., potentiometers) on the current sources. Such adjustments would be made until the estimated diffusion tensor for a standard sample (i.e., having a known diffusion tensor) is substantially equivalent to the known diffusion tensor. Further, by calculating the required transformation between the measured diffusion tensor and the known diffusion tensor, the actual amount of adjustment for the respective coordinates may be calculated. This mechanical adjustment method could be automated, for instance, by using stepper motors, preferably in a feedback loop, to drive a means for adjusting the magnet orientation, and by adjusting the current levels via the processor means 15.

Alternatively, the gradient alignment and gain correction could be performed without mechanical adjustment as an application of the processor means 15 (e.g., in software and/or hardware), or another processing module. As mentioned hereinabove, after measuring the diffusion tensor for the standard, the relative coupling of the gradients, the respective gain, and their orientation with respect to the static magnetic field, may be determined by calculating the transformation between the observed diffusion tensor and the known diffusion tensor. Preferably, this information may then be used to modify the NMR pulse sequence used for a specific application such that the coupling effects are accounted for, and thus effectively eliminated. Alternatively, this information may be used after the NMR pulse sequence is used to modify the interpretation of the received signal.

In the preferred embodiment, this method is used with an isotropic media such as water, having an isotropic effective diffusion tensor. In order to ascertain whether there is misalignment and improper scaling, in accordance with a previously described embodiment of the present invention, multivariate regression techniques are used to estimate the diffusion tensor and determine whether there are statistically significant differences among its diagonal components, and between off-diagonal components.

As discussed above, an embodiment of the method presented herein is based upon finding a transformation between the prescribed or desired magnetic field gradients, which are assumed to be orthogonal and aligned with static magnetic field, and the actual gradients, which may be non-orthogonal, misaligned with the static field, and improperly scaled. This method is equivalent to finding the transformation that makes the diffusion tensor isotropic. Once this transformation is known, subsequent estimates of the diffusion tensor for tissue using the same pulse sequence can be corrected. This procedure is tantamount to "whitening" correlated signals. If the measurement errors are ascribed to misalignment of gradients and improper scaling of G, their effects can be essentially negated by using a method akin to inverse filtering.

First, observe that equation (20) can be rewritten as a quadratic form using analytical expressions for the $b_{ij}$ derived for trapezoidal pulses, $$\ln\left(\frac{A(TE)}{A(0)}\right) = -\gamma^2 \left(\delta^2\left(\Delta - \frac{\delta}{3}\right) + \frac{\epsilon^3}{30} - \delta\frac{\epsilon^2}{6}\right) G_o^T \underline{D}_o G_o \quad (31)$$

where $G_o = (G_{ox}, G_{oy}, G_{oz})^T$ is the prescribed magnetic field gradient vector, and $D_o$ is the estimated diffusion tensor. The measured diffusion tensor of an isotropic material should be isotropic, i.e., $$\underline{D}_{iso} = D_0 \begin{pmatrix} 1 & 0 & 0 \\ 0 & 1 & 0 \\ 0 & 0 & 1 \end{pmatrix} \quad (32)$$

where $D^o$ is the diffusion constant of the phantom. The objective is to find a transformation to apply to the prescribed field gradients, which makes the measured diffusivity tensor appear isotropic. This is done by first finding a transformation that makes $D_o$ diagonal, and then another that makes $D_o$ isotropic. First, the diagonal matrix, $\Lambda$, is obtained from the measured diffusion tensor, $D_o$, by a similarity transformation:

$$D_o = E_o \Lambda E_o^T \quad (33)$$

where $E^o$ is the orthogonal matrix of eigenvectors of $D_o$. Then $\Lambda$ is related to $D_o$:

$$E_o \Lambda E_o^T = E_o(\Lambda_o^{1/2} D_{iso} \Lambda_o^{1/2}) E_o^T \quad (34)$$

where $$\underline{\Lambda}_o^{1/2} = \frac{1}{\sqrt{D_o}} \begin{pmatrix} \sqrt{\lambda_{o1}} & 0 & 0 \\ 0 & \sqrt{\lambda_{o2}} & 0 \\ 0 & 0 & \sqrt{\lambda_{o3}} \end{pmatrix} \quad (35)$$

The operator prescribed gradient vector, $G_o = (G_{ox}, G_{oy}, G_{oz})$, is related to the apparent or observed gradient vector, $G = (G_x, G_y, G_z)$; by:

$$G = \Lambda_o^{1/2} E_o^T G_o \text{ or } E_o \Lambda_o^{-1/2} G = G_o \quad (36)$$

It can be seen that $G_o$ is first made perpendicular and rotated by $E^{oT}$, and then scaled by $^{1/2}$ to produce G. To undo the distortion due to misalignment with the laboratory frame, nonorthogonal gradient coils, and current amplitude scaling, the estimated diffusion tensor is forced to appear isotropic by exchanging G and $G_o$. This can be seen by substituting $E_o \Lambda^{-1/2} G_o$ for $G_o$ in equation (36), which yields:

$$\ln\left(\frac{A(TE)}{A(0)}\right) = -\gamma^2 \left(\delta^2\left(\Lambda - \frac{\delta}{3}\right) + \frac{\epsilon^3}{30} - \right. \quad (37)$$
$$\left. \delta\frac{\epsilon^2}{6}\right) (E_o\underline{\Lambda}_o^{-1/2}G_o)^T E_o\underline{\Lambda}_o^{1/2}\underline{D}_{iso}\underline{\Lambda}_o^{1/2}E_o^T(E_o\underline{\Lambda}_o^{-1/2}G_o)$$

Noting that $E_o^T E_o = E_o E_o^T = \Lambda^{1/2}\Lambda^{-1/2} = I$, yields the predicted relationship between the echo intensity and diffusion gradients for diffusion in an isotropic medium:

$$\ln\left(\frac{A(TE)}{A(0)}\right) = -\gamma^2 D_o |G_o|^2 \left(\delta^2\left(\Delta - \frac{\delta}{3}\right) + \frac{\epsilon^3}{30} - \delta\frac{\epsilon^2}{6}\right) \quad (38)$$

In subsequent spectroscopic or imaging protocols $E_o \Lambda^{-1/2}$ should be applied to each $G_o$. This "whitening" procedure also can be applied iteratively.

EXAMPLES

The following examples are demonstrative of some of the applications and attendant advantages of the present invention, but are not intended to limit the scope thereof.

DIFFUSION SPECTROSCOPY AND IMAGING

Diffusion spectroscopy and imaging of water and pork loin samples were performed on a 4.7 T Spectrometer/Imager (GE Omega™, Fremont, Calif.). The samples were placed on a surface coil and allowed to thermally equilibrate at 14.7° C. in the bore of the magnet. The same surface coil can be used for both spectroscopy and imaging. A spin-echo, trapezoidal pulse-gradient sequence was used for spectroscopy with the isotropic and anisotropic samples, and is shown in FIG. 2. Typically: TR (repetition time)=15 sec; TE=40 msec; δ=4.2 msec; ε=0.2 msec; and Δ=22.5 msec.

For water at 14.7° C., seven noncollinear magnetic field gradient directions were selected: $(G_x, G_y, G_z) = G_o \{(1, 0, 0), (0, 1, 0), (0, 0, 1), (1, 0, 1), (1, 1, 0), (0, 1, 1), \text{ and } (1, 1, 1)\}$.

For each gradient direction, three trials were performed. In each trial, the gradient strength, $G_0$, was increased from 1 to 15 Gauss/cm in increments of 1 Gauss/cm. In all, 315 acquisitions were obtained for each sample or phantom.

This experimental protocol was repeated with an anisotropic pork loin sample at 14.7° C. In one experiment, the muscle fibers of the pork loin sample were approximately aligned with the x-axis of the magnet; in another, the same sample was rotated about 40° in the plane of the xz-axis.

For water, the estimated effective diffusion tensor, $D_{est}$, is given below with its standard error matrix:

$$\underline{D}_{est} = \left( \begin{pmatrix} 1.7003 & -0.0406 & 0.0027 \\ -0.0406 & 1.6388 & -0.0036 \\ 0.0027 & -0.0036 & 1.7007 \end{pmatrix} + \begin{pmatrix} \pm 0.0057 & \pm 0.0054 & \pm 0.0055 \\ \pm 0.0054 & \pm 0.0056 & \pm 0.0054 \\ \pm 0.0055 & \pm 0.0054 & \pm 0.0057 \end{pmatrix} \right) \times 10^{-3} \frac{mm^2}{sec} \quad (39)$$

Multiple hypothesis testing was used to assess whether $D_{est}$, is an isotropic matrix subject to explainable experimental statistical variability, with the null hypothesis being that the diffusion tensor is isotropic, i.e., $$\underline{D}^{null} = D_0 \underline{I} \text{ where } \underline{I} = \begin{pmatrix} 1 & 0 & 0 \\ 0 & 1 & 0 \\ 0 & 0 & 1 \end{pmatrix} \quad (40)$$

$D^{eff}$ was again estimated from the same data set, assuming the null hypothesis to be true. This reduced model, (C. R. Rao, "Linear Statistical Inference and its Applications," Wiley and Sons, New York (1965)), contains five linear constraint equations, three setting the off-diagonal elements to zero, and two forcing the three diagonal elements to equal one another. Assuming the null hypothesis to be true, the estimated effective diffusion tensor was estimated as:

$$\underline{D}_{est}^{null} = (1.6675 \pm 0.0033) \times 10^{-3} \frac{mm^2}{sec} \underline{I} \quad (41)$$

or $$D_0 = (1.6675 \pm 0.0033) \times 10^{-3} \frac{mm^2}{sec}$$

The adjusted coefficient of determination, $r^2 = 0.999999$ for $N = 315$.

The F-distribution was used to determine whether to accept or reject the null hypothesis, the relevant F-statistic being, (G. W. Snedecor, "Statistical Methods," Eighth Edition, Iowa State University Press, Ames, (1989)):

$$F_0 = \frac{(R_c - R_u)/(k - r)}{R_c/(N - (k + 1))} \quad (42)$$

where k and r are the number of free parameters in the unconstrained and constrained models, respectively; N is the total number of experimental data points; and $R_u$ and $R_c$ are the residual sums-of-squares for the unconstrained and constrained models, respectively.

For the water phantom, $r=1$, $k=7$, and $N=315$, so that $F_0=21.5$ using the above equation. However, since $F(k-r, N-(k+1))=2.87$ and 2.13 for the 1% and 5% confidence limits, respectively, the null hypothesis of isotropy should be rejected.

The estimated diffusion tensor for the anisotropic pork sample with the fiber directions approximately aligned with the x axis is:

$$\underline{D}_{est} = \left( \begin{pmatrix} 1.0513 & 0.535 & -0.0040 \\ 0.0535 & 0.9697 & 0.0256 \\ -0.0040 & 0.0256 & 0.8423 \end{pmatrix} + \begin{pmatrix} \pm 0.0055 & \pm 0.0044 & \pm 0.0043 \\ \pm 0.0044 & \pm 0.0053 & \pm 0.0043 \\ \pm 0.0043 & \pm 0.0043 & \pm 0.0051 \end{pmatrix} \right) \times 10^{-3} \frac{mm^2}{sec} \quad (43)$$

(Adjusted $r^2 = 0.999999$; $N=294$).

Figure 5A:
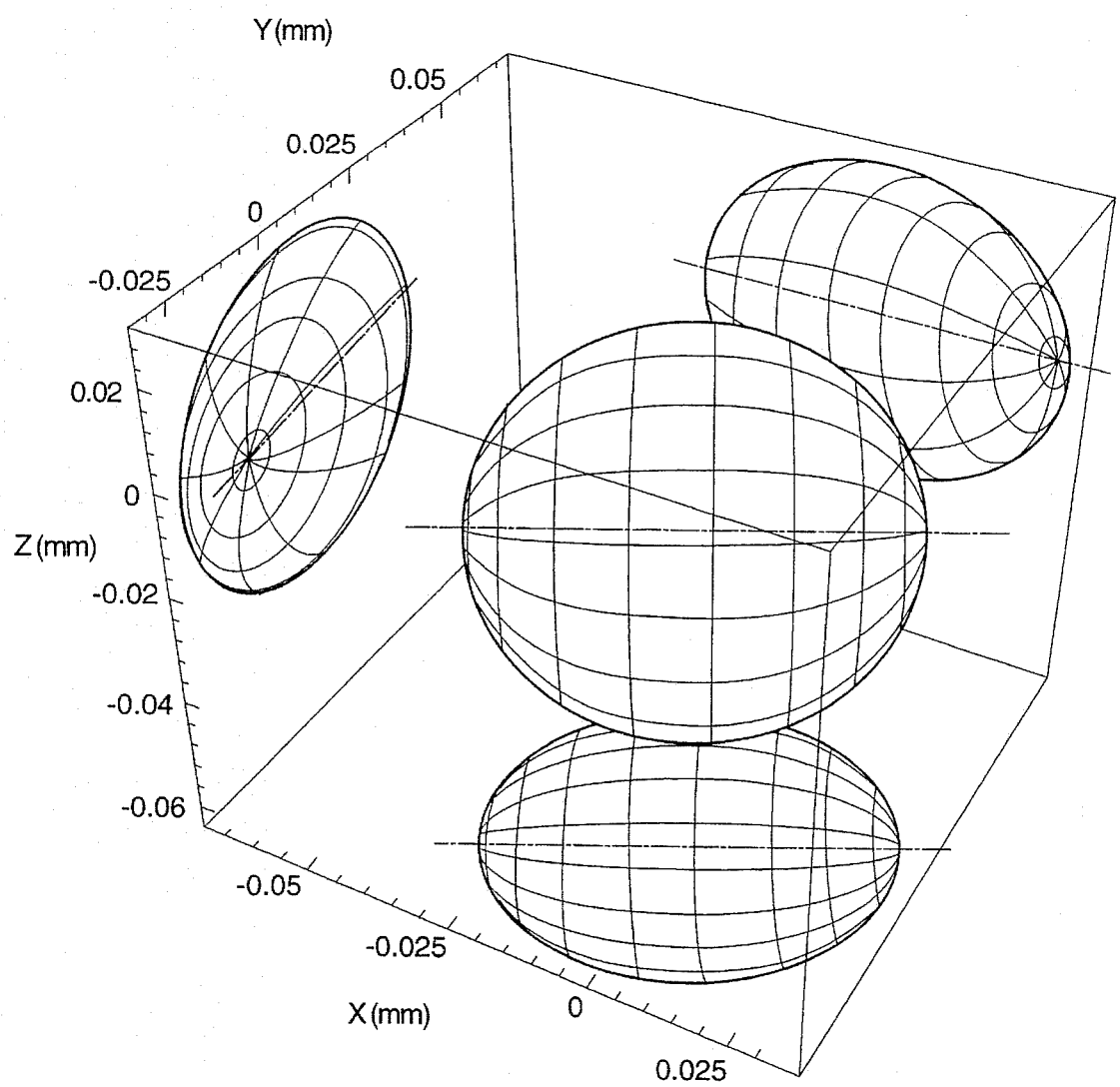
FIG. 5A is a diffusion ellipsoid, in accordance with the present invention, for a pork loin sample with its fiber axis approximately aligned with the X-axis of the laboratory frame of reference.

In accordance with a preferred embodiment of the present invention, diffusion ellipsoids were generated and are shown in FIG. 5A. Projections onto the set of planes formed from the coordinate axes are represented by regions 31, 32, and 33. To represent the case in which the off-diagonal elements are ignored, the estimation of $D^{eff}$ was repeated assuming the null hypothesis that the matrix is diagonal. Three constraint equations were used to force all off-diagonal elements to be zero. Under these conditions, $r=4$, $k=7$, and $N=294$, so that $F_0=38.49$ using the above equation for $F_0$. Now $F(k-r, N-(k+1))=3.85$ and 2.64 for the 1% and 5% confidence limits, respectively. Thus, the null hypothesis that the matrix is diagonal should be rejected.

In the second experiment with the same pork loin sample, the fiber directions were rotated by approximately 40° with respect to the x axis in the x-z plane. The estimated diffusion tensor is now given by:

$$\underline{D}_{est} = \left( \begin{pmatrix} 0.9761 & 0.0278 & -0.0748 \\ 0.0278 & 0.9529 & -0.0106 \\ -0.0748 & -0.0106 & 0.9653 \end{pmatrix} + \begin{pmatrix} \pm 0.0039 & \pm 0.0039 & \pm 0.0031 \\ \pm 0.0031 & \pm 0.0031 & \pm 0.0031 \\ \pm 0.0031 & \pm 0.0031 & \pm 0.0039 \end{pmatrix} \right) \times 10^{-3} \frac{mm^2}{sec} \quad (44)$$

Figure 5B:
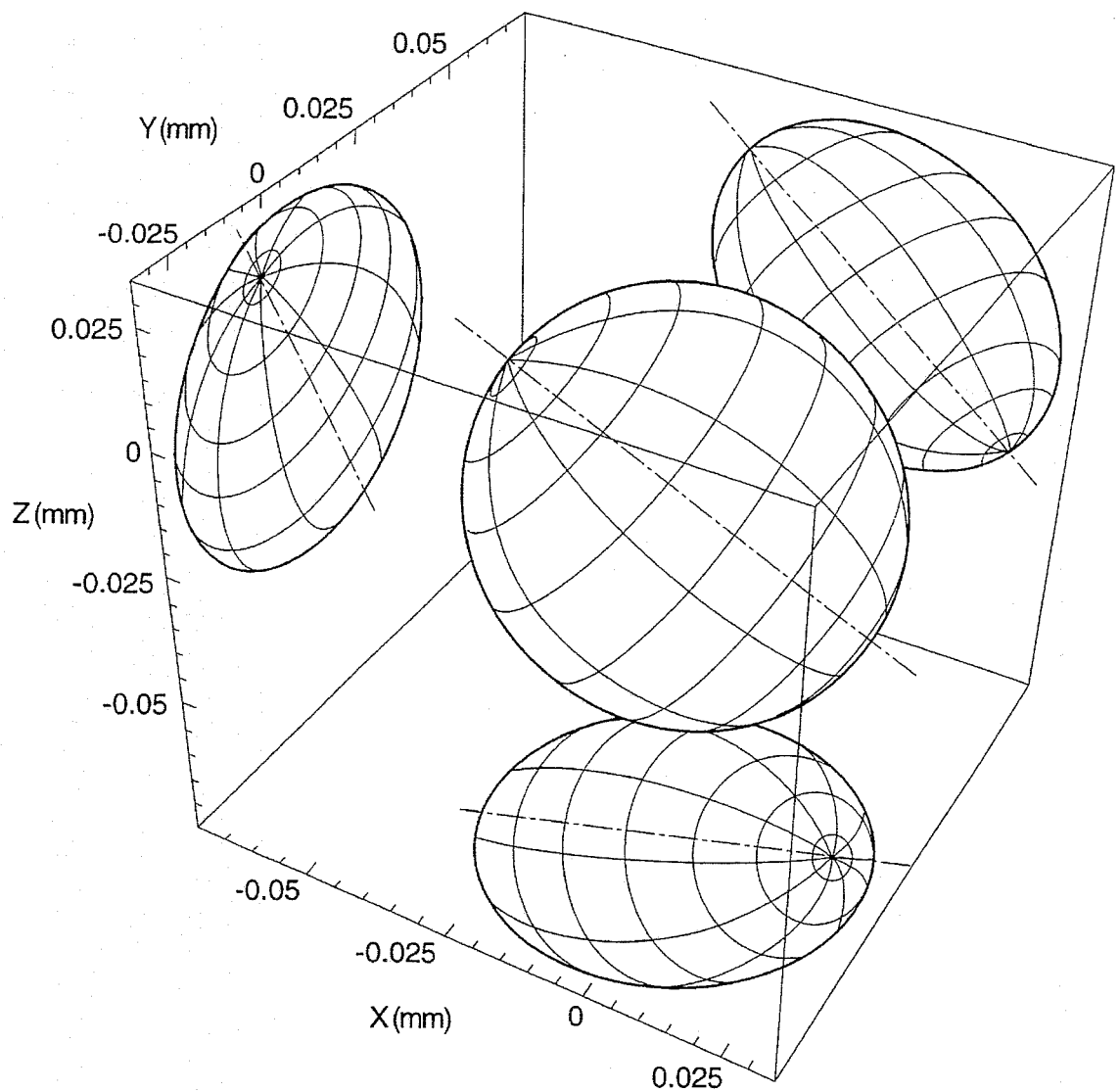
FIG. 5B is a diffusion ellipsoid, in accordance with the present invention, for a pork loin sample with its fiber axis approximately rotated 40° with respect to the x-axis of the laboratory frame of reference.
Figure 6:
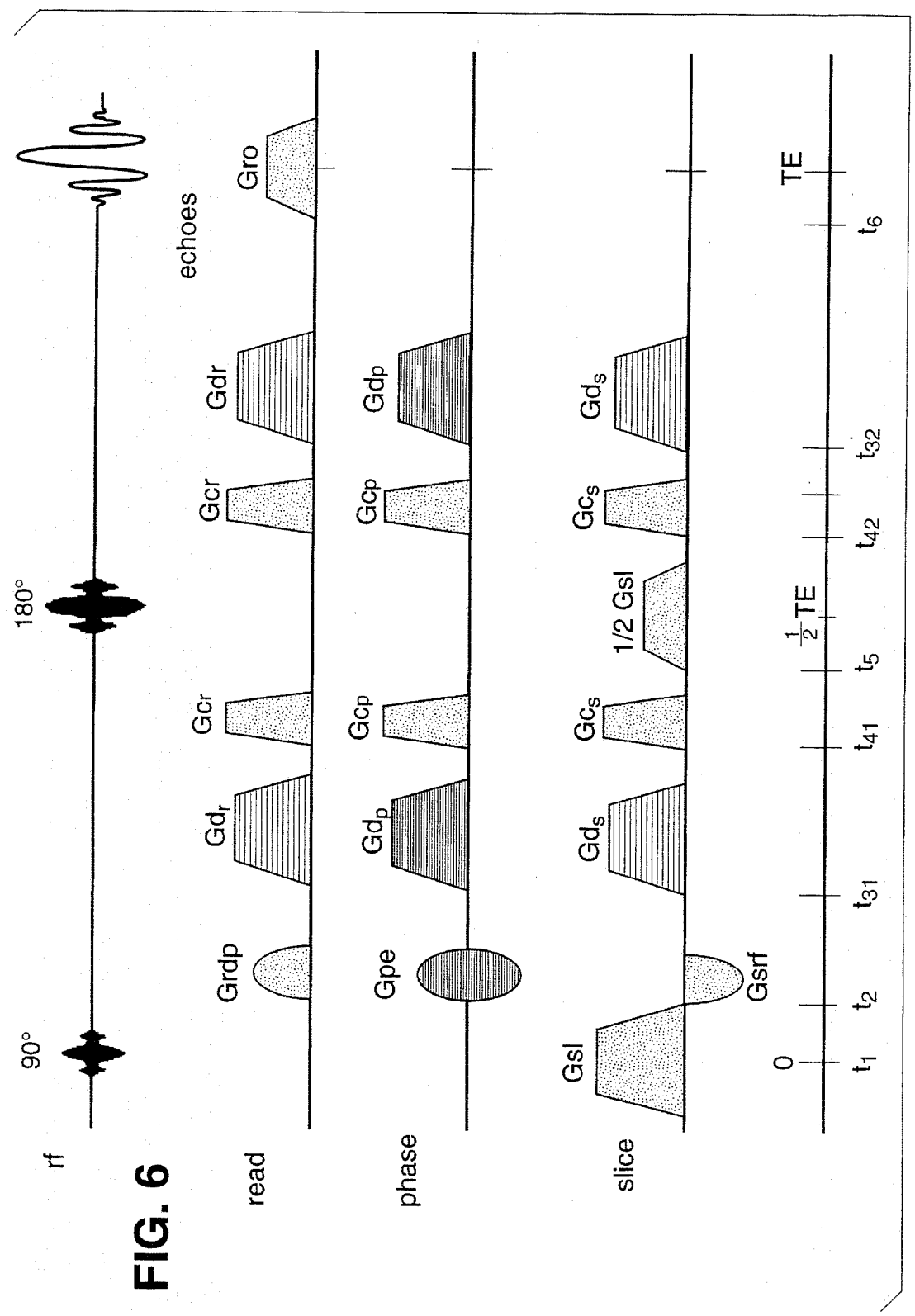
FIG. 6 shows a 2D-FT spin-echo, imaging pulse sequence used to acquire NMR diffusion weighted images, in accordance with the present invention.

(Adjusted $r^2 = 0.999999$; $N=294$)

and the corresponding diffusion ellipsoid image is shown in FIG. 5B. The eigenvectors that define the orthotropic fiber frame follow the sample as it is rotated, as demonstrated by the measured tipping of the polar axis by 42° from that shown in FIG. 5A to that shown in FIG. 5B. Both effective diffusion ellipsoids shown in FIGS. 5A and 5B are only slightly prolate, presumably because the diffusion time $\Delta=22.5$ ms, corresponding to a mean diffusion distance of 4.7 μm, is too short for the majority of spin-labeled protons to encounter diffusion barriers. The scalar invariants of $D^{eff}$ differ by no more than 1% in both spectroscopy experiments although the components of the $D^{eff}$ differ by a much greater amount. This result indicates that the invariants are intrinsic to $D^{eff}$ and depend upon the sample's microstructure, and thus are independent of the sample's orientation within the magnet.

To represent the case in which the off-diagonal elements are ignored, we estimate $D^{eff}$ assuming the null hypothesis that the matrix is diagonal. Under these conditions, $r=4$, $k=7$, and $N=294$, so that $F_0=66.24$. Again, for $F(k-r, N-(k+1))=3.85$ and 2.64 for the 1% and 5% confidence limits, respectively. The null hypothesis that the estimated diffusion matrix for the rotated sample is diagonal should also be rejected.

In all of these experiments, the estimation of the error variance matrix, $\Sigma^{-1}$, was corrected for the logarithmic transformation of the measured echo intensities, so that both the estimation of each component of the diffusion tensor and its error variance (given in $M^{-1}$) were optimal. Independent trials were performed to estimate the error variance of A(G)

$\sigma^2_{ii}$, as a function of |G|. They showed that $\sigma_{ii}$~150 and were approximately uniform, independent of magnetic field gradient strength and direction. The estimated parameters obtained using weighted multivariate linear regression agreed with those obtained using a nonlinear Levenberg-Marquardt algorithm using the untransformed form of equation (6) relating the echo intensity and the diffusion tensor:

$$\underline{D}_{est} = \left( \begin{pmatrix} 0.9761 & 0.0278 & -0.0748 \\ 0.0278 & 0.9529 & -0.0106 \\ -0.0748 & -0.0106 & 0.9653 \end{pmatrix} + \begin{pmatrix} \pm 0.0039 & \pm 0.0039 & \pm 0.0031 \\ \pm 0.0031 & \pm 0.0031 & \pm 0.0031 \\ \pm 0.0031 & \pm 0.0031 & \pm 0.0039 \end{pmatrix} \right) \times 10^{-3} \frac{mm^2}{sec} \quad (45)$$

For both isotropic and anisotropic samples, standard errors were small compared with the estimated parameters, and the adjusted multiple coefficient of determination, $r^2$ is approximately equal to one to within six significant digits. This shows that the multivariate linear model fits the data faithfully. In addition, the diffusivity, $D_0$, estimated by assuming water to be isotropic and homogeneous, is close to published values for water at 14.7° C. Despite this agreement, from the experimental data, the hypothesis that the estimated self-diffusion tensor for water is isotropic and homogeneous to within known instrumental variability should be rejected. The diagonal element $D_{yy}$ differed from the other two by statistically significant amounts, and $D_{xy}$ was significantly larger than zero. As self-diffusion of water is thought to be isotropic, this measured anisotropy must be the result of a systematic instrumental error, most likely, a coupling between the x and y magnetic field gradients.

In addition, it is estimated that slight misalignment (less than one degree) of the gradient directions with respect to the large, steady magnetic field will create a disparity between the matrix calculated analytically or numerically from the prescribed pulse sequence and the experimental matrix. This apparent anisotropy is not disconcerting because NMR diffusion spectroscopy is exquisitely sensitive to magnetic field gradient uniformity, orthogonality, and amplitude control. In fact, in accordance with a hereinabove describe embodiment of the present invention, the measured diffusion anisotropy can be used to great advantage as the basis for calibrating and aligning magnetic field gradients.

As expected, significantly larger differences are observed between diagonal components of the estimated of $D^{eff}$ for the pork-loin sample than for water, so that by comparison, water appears isotropic.

DIFFUSION TENSOR IMAGING

NMR diffusion tensor imaging of ex vivo cat brain was also performed with the same surface coil used in spectroscopy and in the same 4.7-Telsa spectroscopy/imaging system described above. A 2D-FT (i.e., two-dimensional fourier transform) spin-echo pulsed-gradient sequence, shown in FIG. 6, was used to acquire the sagittal images of a cat brain that had been excised 40 hours before the experiment. Diffusion gradients were applied along the three coordinate directions (read, phase, and slice) in 9 noncollinear directions, as they were in the spectroscopy experiments. For a typical imaging sequence: slice thickness=5 mm, ε=0.5 msec., TE=80 msec, the number of phase-encode steps=128, and the block size=128. The time at which the gradient pulse turns on during the pulse sequence ($t_k$), as well as gradient intensities in the read, phase, and slice directions are given in Table 1.

TABLE 1

| i | $\delta_i$ μsec | $t_i$ μsec | $G_i$ | G/mm |
|---|---|---|---|---|
| 1 | 2450.0 | 1475.0 | Gsl | +0.241 |
|   |   |   | Grdp | +0.214 |
| 2 | 2000.0 | 1475.0 | Gpe | +0.000 |
|   |   |   | Gsrf | +0.232 |
|   |   |   | Gd$_r$ | 0 to +1.400 |
| 31 | 4500.0 | 5525.0 | Gd$_p$ | 0 to +1.400 |
|   |   |   | Gd$_s$ | 0 to +1.400 |
|   |   |   | Gc$_r$ | +0.500 |
| 41 | 4500.0 | 15525.0 | Gc$_p$ | +0.500 |
|   |   |   | Gc$_s$ | +0.500 |
| 5 | 2450.0 | 38525.0 |   |   |
| 42 |   | 59475.0 |   |   |
| 32 |   | 69475.0 |   |   |
| 6 | 3714.5 | 77892.75 | Gro | +0.147 |

Figure 7:
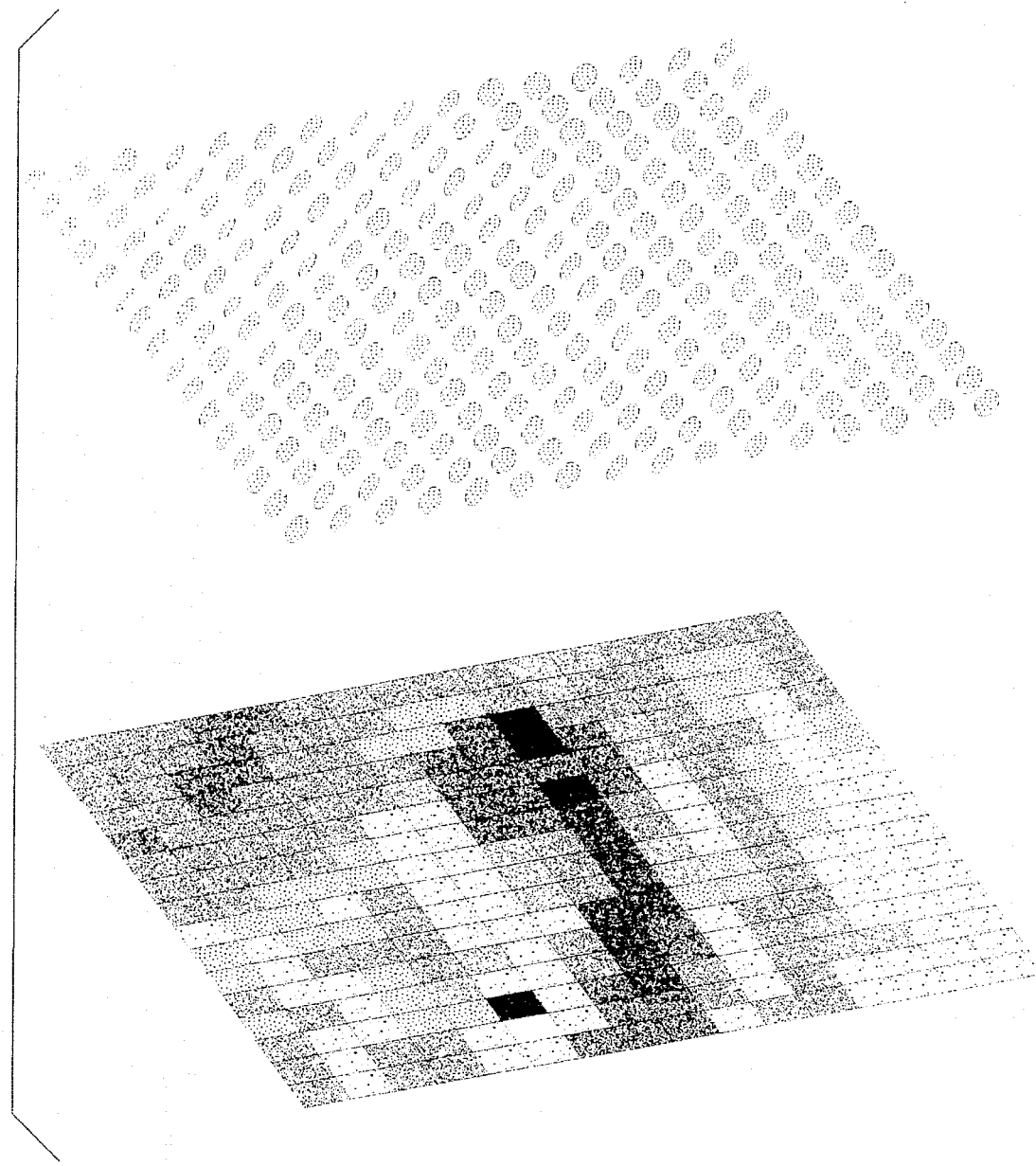
FIG. 7 shows a 16×16 pixel gray scale image and a corresponding diffusion ellipsoid image, in accordance with the present invention.

Using the NMR diffusion tensor imaging method described above, an effective diffusion tensor was estimated in each voxel within a 16×16 pixel region of tissue containing the corpus callosum and a ventricle. FIG. 7 shows the 16×16 pixel gray scale image (the T2-weighted image, A(0)) juxtaposed with an image of its corresponding effective diffusion ellipsoids that were constructed from the estimated $D^{eff}$ within each voxel.

The effective diffusion ellipsoids constructed for each of the 16×16 voxels shown in FIG. 7 correspond to the known tissue composition and fiber orientation in this region of brain tissue. The fibers within the corpus callosum are properly oriented (i.e., they correlate with known anatomy), while other structures are clearly discernible. For example, the voxel with the large spherical ellipsoid corresponds to a ventricle filled with CSF. Gray and white matter are easily distinguishable. Moreover, spatial gradients in fiber-tract orientation are seen. It is understood that in order to further represent the information contained in the diffusion ellipsoid image, the diffusion ellipsoids may be projected onto any predetermined plane. For instance, by projecting the diffusion ellipsoids onto the sagittal plane, the diffusivity and related microstructure in this plane is represented.

Figure 8:
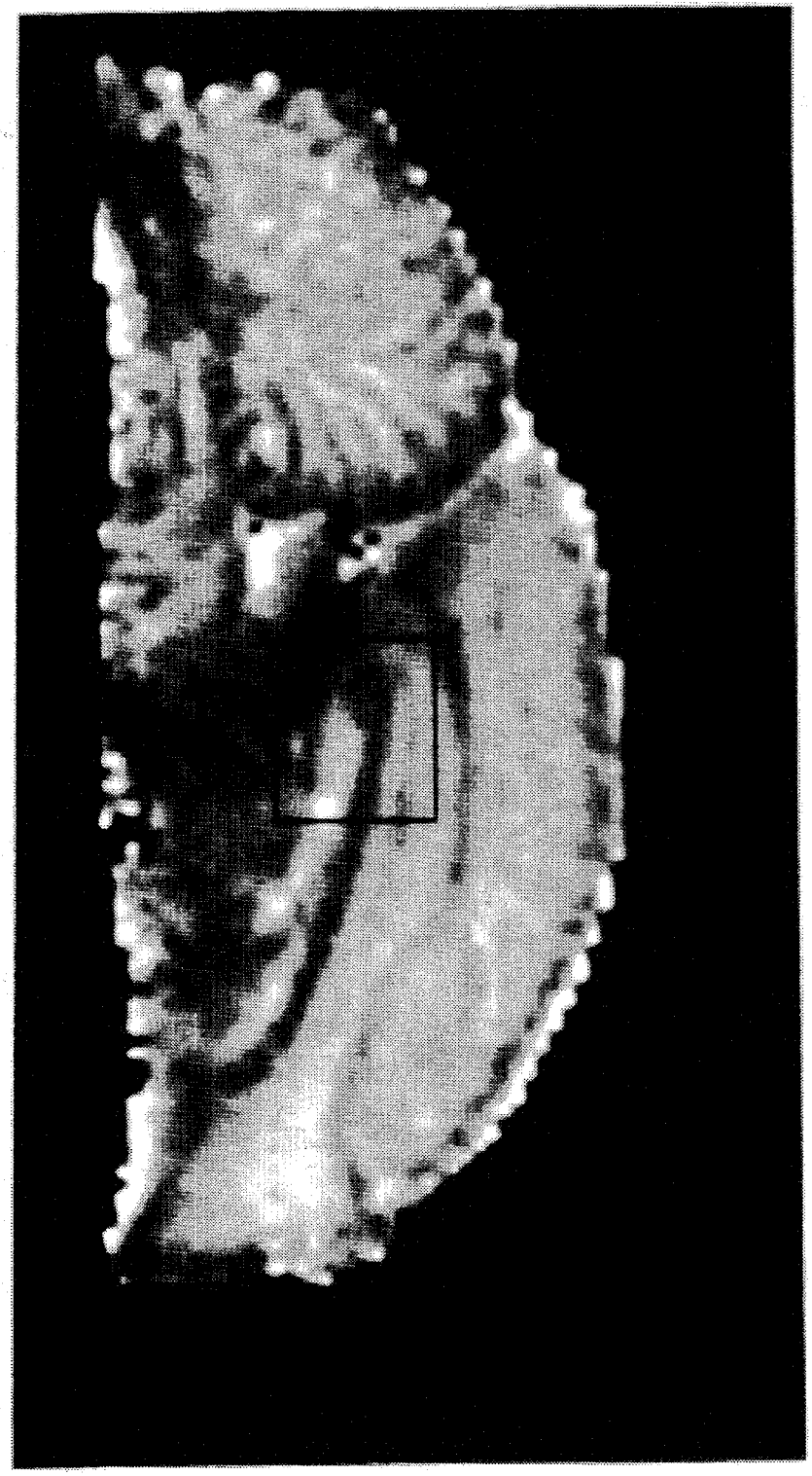
FIG. 8 shows an image constructed from a scalar invariant, the trace, of the diffusion tensor, in accordance with the present invention.

FIG. 8 shows an image of the first scalar invariant, $Tr(D^{eff})$, for the sagittal slice of the excised cat brain. It is easy to distinguish regions of CSF, and gray and white matter, fissures and the corpus callosum, all of which was not apparent in a raw proton image of the same tissue. While these differences are also apparent in $T_1$ or $T_2$ weighted images, the scalar invariants offer additional information with which to segment biological tissues.

In the foregoing detailed description, it has been explicitly assumed that diffusion coefficients are independent of space within a voxel. For this condition to be satisfied, the transport of magnetization in the Bloch equation (19) must be dominated by gradients in the magnetization itself, rather than in the diffusivity, i.e., $$\nabla \cdot (D \nabla \Psi) = \frac{\partial}{\partial x_i} \left( D_{ij} \frac{\partial \Psi}{\partial x_j} \right) = \frac{\partial D_{ij}}{\partial x_i} \frac{\partial \Psi}{\partial x_j} + D_{ij} \left( \frac{\partial^2 \Psi}{\partial x_j \partial x_i} \right) \approx D_{ij} \left( \frac{\partial^2 \Psi}{\partial x_j \partial x_i} \right) \quad (46)$$

For this condition to be satisfied, the fractional change in the diffusivity over a voxel must be much less than one, i.e., $$\frac{\partial \ln(D_{ij})}{\partial x_i} dx_i \ll 1 \qquad (47)$$

where $dx_i$ is the size of the voxel in the $x_i$ direction.

In microscopically heterogeneous systems, the estimated effective diffusion coefficients may depend upon the diffusion time. When the diffusion time $\tau'$ of the experiment is small with respect to the time to diffuse to the nearest permeable barrier, i.e., $\tau' \ll \langle r^2 \rangle /D$, where $\langle r^2 \rangle$ is the mean square distance between permeable barriers the effective diffusion tensor may appear isotropic; when the diffusion time of the experiment is long, then the macroscopic molecular displacements will appear more anisotropic. Control of the echo time, TE, provides a means for adjusting the contrast expressed through the anisotropy. Furthermore, if a process such as edema is monitored, in which the characteristic time of swelling may be significantly longer than the diffusion time of the experiment, the assumption that the diffusion coefficient is independent of time during each experiment may still be valid.

Although the above description provides many specificities, these enabling details should not be construed as limiting the scope of the invention, and it will be readily understood by those persons skilled in the art that the present invention is susceptible to many modifications, adaptations, and equivalent implementations without departing from this scope. For example, as previously discussed, although in the preferred embodiment gradient fields are applied in three mutually orthogonal directions, the gradient fields may be applied in only two directions, resulting in estimation of the diffusion tensor in two dimensions. In addition, there may be many variations in the specific pulse-gradient spin-echo sequences used for generating the echo signals. Moreover, other pulse sequences may be used in accordance with the present invention (e.g., echo planar, gradient recalled echo, etc.), (P. J. Basser, et al., Proc. SMRM Workshop: Functional MRI of the Brain, Arlington, Va., 1993, p 224).

As understood by one skilled in the art, the present invention is not limited to nuclei, but may also be applied to other spin-labeled particles. For example, since an analogous Bloch equation can be formulated for electrons, the present invention may be applied to electron spin resonance (ESR), which is known in the art as a direct analog of NMR. Thus, a relation can be derived between the ESR signal and the diffusion tensor, ESR pulse sequences may be designed accordingly and applied to the ESR apparatus, and the diffusion tensor may be calculated from the received signals according to the derived relation.

Moreover, diffusion NMR imaging could be performed with species other than water, such as phosphocholine, phosphocreatine, and N-acetyl-aspartate, all of which have a net charge at physiological pH. Charged moieties may behave differently in response to the applied field gradients, owing to the body (i.e., Lorentz) force they experience. For them, the diffusion tensor is not necessarily symmetric. To estimate D for charged species, all six off-diagonal elements may have to be included. Notwithstanding, the estimation methods described hereinabove should continue to be applicable with this modification.

In addition, it may be possible to maximize the information gain per experiment by using improved statistical estimation methods. For instance, the error variances of $D^{eff}$ may be minimized subject to the known constraints. Several independent variables can be manipulated to increase the information gained per experiment, including the total number of trials and the magnetic field gradient vector (strength and direction) in each trial. Significant error variance reduction may be achieved by ensuring that the columns of the design matrix are orthogonal. An optimal experimental protocol may maximize the signal-to-noise ratio for each measurement; it could use a priori information about the coefficients of the diffusion tensor, such as correlations among its components within a voxel and between neighboring voxels. It could also be implemented like a Kalman filter that uses sampled data to continuously update its parameter estimates.

These and other changes can be made without departing from the spirit and the scope of the invention and without diminishing its attendant advantages. It is therefore intended that the present invention is not limited to the disclosed embodiments but should be defined in accordance with the claims which follow.

We claim:

1. A magnetic resonance spectroscopy system comprising:
   means for applying a static magnetic field to an object under examination;
   means for applying gradient magnetic fields to the object;
   means for applying a high frequency pulse to the object;
   detecting means for detecting a magnetic resonance signal from the object;
   control means for causing said means for applying gradient magnetic fields, and means for applying a high frequency pulse to operate in a predetermined sequence so as to induce magnetic resonance within the object, wherein said control means includes means for generating a plurality of echo signals corresponding to non-collinearly dependent directions of said gradient magnetic fields; and
   means for processing data based on the magnetic resonance signal detected by said detecting means to obtain magnetic resonance information, wherein said means for processing data provides a signal that is a function of the components of a diffusion tensor representing translational displacement of spin labeled species for said object on the basis of said plurality of echo signals according to a predetermined relationship between said echoes and said components.

2. The system according to claim 1, wherein said predetermined sequence includes an imaging pulse sequence which induces said plurality of echo signals such that said means for processing data obtains the components of a plurality of said diffusion tensors corresponding to a respective plurality of regions of said object.

3. The system according to claim 2, wherein said means for data processing generates an image constructed from said components of said diffusion tensor.

4. The system according to claim 3, wherein said image is based on the eigenvectors and eigenvalues of said diffusion tensor.

5. The system according to claim 3, wherein said image is constructed from diffusion ellipsoids.

6. The system according to claim 3, wherein said image is constructed from functions of scalar invariants of said plurality of diffusion tensors.

7. The system according to claim 1, wherein said predetermined sequence generates said plurality of echo signals for a localized region of said object.

8. The system according to claim 1, further comprising means for calibrating said gradient magnetic fields.

9. The system according to claim 1, further comprising an image reconstruction means for obtaining an image based on said components of the diffusion tensor.

10. The system according to claim 1, further comprising a means for adjusting the orientation and field strength of said gradient magnetic fields based on measurement of said diffusion tensor for said object under examination, wherein said diffusion tensor is known.

11. The system according to claim 10, wherein said object under examination is characterized by isotropic diffusion, and thereby has a diagonal diffusion tensor.

12. A method for estimating at least one component of a diffusion tensor representing translational displacement of spin labeled species for a sample inserted in an NMR apparatus comprising the steps of:

deriving a relationship between an NMR signal and said diffusion tensor;

generating a pulse sequence in said NMR apparatus for generating said NMR signal;

calculating said at least one component of said diffusion tensor based on said NMR signal, according to said relationship.

13. The method according to claim 12, wherein said pulse sequence includes an imaging pulse sequence for generating a signal used for constructing a diffusion weighted image.

14. The method according to claim 12, wherein said pulse sequence includes an imaging pulse sequence which induces a plurality of said NMR signals such that said components of a plurality of said diffusion tensors, corresponding to a respective plurality of regions of said object, may be calculated in said calculating step.

15. The method according to claim 14, further comprising the step of generating images based on information contained in said said diffusion tensor.

16. A method for estimating at least one component of a diffusion tensor representing translational displacement of spin labeled species for a localized region of a sample comprising the steps of:

immersing the sample in a static magnetic field;

exciting nuclear magnetic resonance echoes in said sample by application of a predetermined pulse sequence;

calculating said at least one component of said diffusion tensor based on said echoes, according to a predetermined relationship between said echoes and said components.

17. The method according to claim 16, further comprising the step of generating images based on information contained in said said diffusion tensor.

18. A method for estimating at least one component of a diffusion tensor representing translational displacement of spin labeled species for a sample inserted in a resonance apparatus, said resonance apparatus having means for inducing a signal in said sample, including means for generating gradient magnetic fields in non-linearly dependent directions, means for applying a static magnetic field, means for generating high frequency pulses, and means for receiving said signal, comprising the steps of:

deriving a relationship between said signal and said diffusion tensor;

generating a pulse sequence in said resonance apparatus for generating said signal;

calculating said at least one component of said diffusion tensor based on said signal, according to said relationship.

19. The method according to claim 18, further comprising the step of adjusting said gradient magnetic fields based on said diffusion tensor for said sample, wherein said diffusion tensor is known.

20. A NMR apparatus comprising:

means for generating an echo signal in said sample; and means for processing said echo signal into a signal that is a function of a diffusion tensor representing translational displacement of spin labeled species for said sample.

21. The NMR apparatus of claim 20, wherein said echo signal is a spin echo signal.

22. The NMR apparatus of claim 20, wherein said echo signal is generated in a voxel.

23. The NMR apparatus of claim 22, further comprising means for combining echo signal from a plurality of voxels of said sample.

24. The NMR apparatus of claim 20, said NMR apparatus having means for generating orthogonal gradient fields and means for applying a static magnetic field, said apparatus further comprising means for aligning and calibrating said orthogonal gradient fields according to the signal representative of the diffusion tensor.

25. A method for measuring NMR of a sample inserted into a NMR apparatus, comprising the steps of:

generating an echo signal in said sample; and processing said echo signal into a signal that is a function of a diffusion tensor representing translational displacement of spin labeled species for said sample.

26. The method according to claim 25, wherein said signal includes at least one component of said diffusion tensor.

27. The method according to claim 25, wherein said signal includes a diffusion constant of said diffusion tensor.

28. The method according to claim 25, wherein said diffusion tensor includes two spatial dimensions.

29. The method according to claim 25, wherein said NMR apparatus includes means for generating orthogonal gradient fields and means for applying a static magnetic field, said method further comprising the step of aligning and calibrating said orthogonal gradient fields according to the signal representative of a diffusion tensor.

30. The method according to claim 25, wherein said signal includes a function of a trace of said diffusion tensor.

31. The method according to claim 25, wherein said signal includes a signal related to an eigenvector of said diffusion tensor.

32. The method according to claim 25, wherein said signal includes a function of an eigenvalue of said diffusion tensor.

33. A method for measuring NMR of a sample inserted into a NMR apparatus, said method comprising the steps of:

generating an echo signal in said sample, said echo signal encoded according to the diffusion tensor of said spatially translating component; and processing said echo signal into a signal representative of a diffusion tensor representing translational displacement of spin labeled species for said sample.

34. The method according to claim 33, wherein said echo signal is generated within a localized region of said sample.

35. The method according to claim 33, wherein said step of generating an echo signal includes the step of applying a pulse sequence for driving magnetic field gradients of said NMR apparatus such that said echo signal represents a combination of different elements of the diffusion tensor.

* * * * *